PROCESS FOR MAKING HARD SURFACE TRANSPARENT MASK

Original Filed Nov. 13, 1967

EUGENE R. BLOME
SAMUEL S.M. FOK
INVENTOR

Alan H. MacPherson

ATTORNEY 3,712,816

PROCESS FOR MAKING HARD SURFACE TRANSPARENT MASK

Eugene R. Blome, San Jose, and Samuel S. M. Fok, Palo Alto, Calif., assignors to Fairchild Camera and Instrument Corporation, Syosset, N.Y.

Original application Nov. 13, 1967, Ser. No. 682,458, now Patent No. 3,625,728, dated Dec. 7, 1971. Divided and this application Oct. 29, 1970, Ser. No. 85,006
Int. Cl. G03c *5/00*
U.S. Cl. 96—38.3 3 Claims

ABSTRACT OF THE DISCLOSURE

A mask comprising a hard surface layer formed into a desired pattern is provided for use in photo fabrication. The layer is visually transparent but opaque to the range of wave lengths used to expose the photopolymer on the part being photo fabricated.

CROSS-REFERENCE TO RELATED APPLICATION

This application is a division of U.S. application Ser. No. 682,458 filed Nov. 13, 1967 and now U.S. Pat. 3,625,728 issued Dec. 7, 1971.

BACKGROUND OF THE INVENTION

Field of the invention

The invention relates to mask construction and methods for forming masks for employment in the photo fabrication of small parts and especially microminiature electronic devices such as integrated circuits.

Discussion of the invention

An important, if not critical, aspect in the fabrication of semiconductor devices, as well as other devices, by photo fabrication is the construction of masks and the methods employed to prepare them. It is recognized that the accuracy of the mask as well as its characteristics are limiting factors in the production of precise microminiature devices and the attainment of high yields. In addition, an important step during the fabrication is the alignment of the mask with the device being formed. The step is generally accomplished optically by aligning various marks on the mask and the part. This is a very tedious process and, when dark-field masks are involved, does not provide a manner of checking the actual alignment. Alignment in this manner hampers operator competence.

The requirements for an acceptable masking material are most stringent. The mask may be employed in a contact printing process wherein the mask and the material being formed are brought into contact and exposed. The masking in such a process must be abrasion and scratch resistant so that its use is not impaired by the contact printing. In addition, the abrasion and scratch resistance is desired so that handling of the mask will not be a particularly critical operation. The mask from such contact printing or other processing often has its surface soiled and requires cleaning. For this reason, it is important that the mask be chemically resistant to chromic acids and detergents, such as are frequently employed in the washing and cleaning of the mask.

The masking material should preferably be easily fabricated into a pattern. For example, it should be susceptible to formation by a single deposition operation. The resulting film from a deposition should be void of imperfections, such as protrusions, inclusions, or voids. The deposited film should be susceptible to a lift off process. Prior art techniques have experienced considerable difficulty in this area, requiring that the lift off be performed by such materials as calcium fluoride, which in itself must be formed by photo-resist films and exposure thereof. While the formed calcium fluoride is effective as lifting layers, they do necessitate additional processing steps.

With the above requirements for the masking material, the material technology has developed to meet this need. For example, masks employing chromium and other materials have been constructed. Masks formed with these materials are generally visually opaque and are also opaque to the range of wave lengths employed in the exposure of the photopolymer via the mask. This opaqueness causes alignment and operator competence problems previously mentioned. These limitations are particularly pronounced when dark-field masks are employed, since it is in these masks that the visual opaqueness of the masking material is most detrimental. With such masks, the operator has no indication of improper alignment, because the accuracy of the alignment is obscured by the dark visually opaque field. These alignment problems increase the number of rejects, cause lower yields, and prohibit attainment of the resolution possible from a given photopolymer positive resist film thickness.

SUMMARY OF THE INVENTION

Briefly, the invented mask comprises a transparent substrate and a pattern of masking material thereon. The masking material is visually transparent and opaque to wave lengths employed for exposing photopolymers employed in the photo fabrication process.

One method for forming a mask comprises the steps of forming a pattern of photopolymer on a transparent substrate; applying a layer of masking material over the pattern of photopolymer material, the masking material being visually transparent but opaque to a specified wave length range; and lifting the photopolymer material from the glass substrate to form a pattern of the masking material.

The above generalized structure and method will be explained with reference to one embodiment shown in the accompanying drawing.

DETAILED DESCRIPTION OF AN EMBODIMENT

Figure 1A:
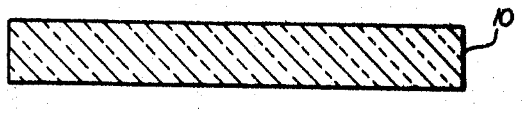
FIG. 1, *a–g*, is a simplified diagram of a process for forming the mask and then employing the mask in a photofabrication process.

Referring to FIG. 1*a*, the starting material for fabrication of the mask is a transparent substrate 10, which is a glass that is transparent visually and transparent to the wave length employed to expose the photopolymer that coats the device or substrate being formed. Typically, the substrate may take the form of a soda-lime glass.

Figure 1B:
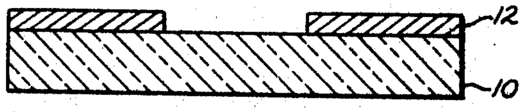
Figure 1C:
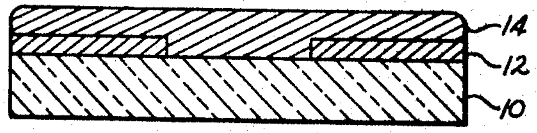

A masking material 14 is formed into a desired pattern (FIG. 1*c*). This may be accomplished by either lifting techniques or etching techniques. It is preferred in this invention to employ a lifting technique which utilizes only a photopolymer, that is, a positive or negative photo-resist. As shown in FIG. 1*b*, a positive thick film polymer, such as manufactured by Shipley under the designations AZ1350, HS AZ1350, and AZ111, is formed into a pattern by well-known photo-engraving techniques. Various photopolymers have been employed with thicknesses as small as 7,000 to 8,000 angstroms, but a range of thickness from 7,000 to 16,000 angstroms is preferred. In the case of positive photo-resist photopolymers, films having a thickness of approximately 14,000 to 16,000 angstroms are preferred. Such a film provides adequate resolution, protection, and structural strength. It has been found that a 16,000 angstrom, positive photo-resist film provides excellent lift off for both dark-field and clear-field masks. Thicknesses under 16,000 angstroms, that is, in the range of 7,000 to 8,000 angstroms, are not particularly useful in connection with the fabrication of dark-field masks from positive resist film.

The masking material 14 is next deposited over the photopolymer 12 by vacuum deposition techniques (FIG. 1*c*). Typically the vacuum deposition has been accomplished under the following conditions:

Rate—50–100 cycles per second/second
Source power—350–400 amperes at 2.5–3.0 volts
Deposition pressure—$6\times10^{-6}$ to $3\times10^{-7}$ torr
Glow discharge—45 15 seconds
Deposition cycle—approximately 15 minutes
Cool down—5 minutes
Source boat—SM series or SO series in an end loading R–D Mathis type
Source material—silicon monoxide (10 mesh size or chunks) no powder.

It has been found that characteristics required for an effective masking material that is visually transparent while opaque to wave length of 3500 to 4500 angstroms, as is commonly employed in exposing photopolymers, is provided by silicon oxide. Silicon oxide transmits less than one percent of wave length of 3650 angstroms, less than one percent of wave length at 4046 angstroms, and less than three percent of the wavelength at 4358 angstroms. Its visual transparency is excellent and the spectral reflectivity is approximately 24 percent in the range of wavelengths from 3650 to 4358 angstroms (with an oxide thickness of 10,000 angstroms). The silicon oxide film has excellent reproducibility characteristics and is very abrasion and scratch resistant. Chemical resistance to chromic acids and detergents is excellent, and it has excellent adhesion to glass. Thus, it can be seen that the silicon monoxide is an especially useful masking material for the purpose of photo fabrication.

Figure 1D:
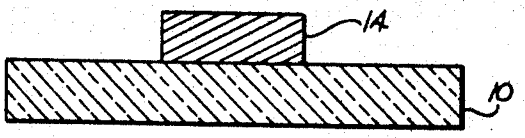
Figure 1E:
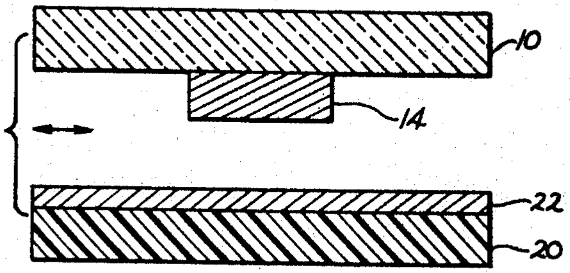

Once the transparent masking material 14 is deposited, the next step in the process is to lift the photopolymer material 12 to form masking material 14 into the desired pattern, as shown in FIG. 1*d*. It has been found that the lifting of the photopolymer material 12 may be effectively accomplished by the use of ultrasonic lifting techniques. It should be noted at this point that the photo-resists alone may be employed for the purpose of lifting. For example, silicon oxide films of 10,000 angstroms and Shipley AZ1350 photo-resist of 7,000 to 8,000 angstroms for lifting have been used to obtain a line-width resolution of 2 microns. It is within the broad scope of the invention to employ lifting materials other than a photopolymer or to use a photopolymer in combination with other materials such as a calcium fluoride. The use of calcium fluoride is described as a lifting material in patent application Ser. No. 509,825, now abandoned, filed Nov. 26, 1965, in the name of William Lehrer and assigned to the assignee of this invention.

The finished mask, shown in FIG. 1*d*, essentially comprises a transparent substrate 10 and a masking material 14. Substrate 10 transmits a substantial portion of all wavelengths and especially those wavelengths that are employed to expose the particular photo-resist. The pattern of masking material 14 is at least visually transparent and opaque to wavelenths that would expose the particular photo-resist employed on the part being fabricated. In addition, material 14 has the requisite characteristics required for the masking function.

From the above, it can be seen that a mask is provided which permits a visual viewing of the entire device as the mask is aligned, yet effectively serves to mask off radiation in a predetermined pattern. Thus, the mask has the advantages of excellent visibility with either positive or negative photo-resist, permitting rapid pattern location when using dark-field masks or clear-field masks with or without alignment marks. The improved visibility increases operator confidence, tends to minimize misalignments, lowers the number of rejects, and increases yields. The improved alignment enables the potential resolution of a particular photo-resist film to be fully realized. In addition, the masking material is susceptible to fabrication by a simple photo-resist lifting procedure. With this simple procedure, resulting line widths in the range of several microns or less may be achieved.

The use of the above mask in a fabrication process is depicted in FIGS. 1(*e*) and 1(*g*). In FIG. 1(*e*), the mask 10, 14 is shown being aligned with a device 20 having a layer of photopolymer material 22, such as AZ1350 or any other suitable photo-resist, positive or negative. The alignment may be accomplished with or without optical aligning marks on the mask and the device 20. The device 20 may be an actual device (e.g., integrated circuit, electrode, etc.), another mask, or a metal part.

Figure 1F:
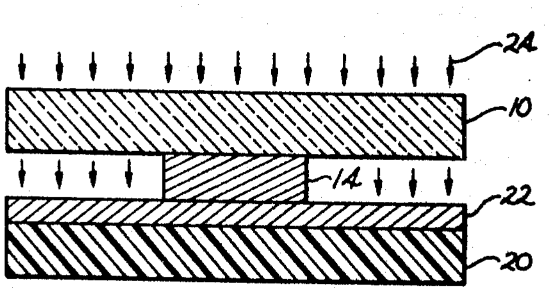
Figure 1G:
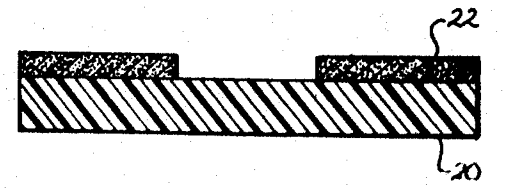

Once alignment is accomplished, the mask may be brought into contact with photo-resist 22 and exposed to ulta-violet radiation 24 (FIG. 1*f*). After the exposure is complete, the mask 10, 14 is removed. The exposed photo-resist is then developed and the device is ready for etching, diffusion, or other appropriate fabrication steps.

Although this invention has been disclosed and illustrated with reference to particular applications, the principles involved are susceptible of numerous other applications which will be apparent to persons skilled in the art.

We claim:

1. The process of forming a mask comprising:
forming a pattern of photopolymer on the face of a substrate transparent to ultraviolet and visible light, said photopolymer being between 7,000 and 16,000 angstroms thick;
applying a layer of silicon monoxide over said pattern of photopolymer materials and the exposed portion of said face not covered by said photopolymer, said silicon monoxide being of such a thickness as to be visually transparent to light of selected wavelengths above 4500 angstroms but opaque to light with wavelengths in the range of 3500 to 4500 angstroms; and
lifting said photopolymer material from said transparent substrate to form a pattern of said silicon monoxide.

2. The process recited in claim 1 wherein said photopolymer material is a positive photo-resist having a thickness of 14,000 to 16,000 angstroms and said silicon monoxide has a thickness on the order of 10,000 angstroms.

3. The process recited in claim 1 wherein said masking material is vacuum deposited.

References Cited

UNITED STATES PATENTS

| | | | |
|---|---|---|---|
| 3,510,371 | 5/1970 | Frankson | 96—36.2 |
| 2,999,034 | 9/1961 | Heidenhain | 117—5.5 |
| 3,412,456 | 11/1968 | Ebisawa | 96—36.2 |
| 3,561,963 | 2/1971 | Kiba | 96—36.2 |
| 3,508,982 | 4/1970 | Shearin | 96—36.2 |
| 3,443,915 | 5/1969 | Wood et al. | 96—36.2 |

J. TRAVIS BROWN, Primary Examiner

E. C. KIMLIN, Assistant Examiner

U.S. Cl. X.R.

96—36.2; 117—5.5